United States Patent
Zhang et al.

(10) Patent No.: US 12,082,337 B2
(45) Date of Patent: Sep. 3, 2024

(54) PRINTED CIRCUIT BOARD AND FABRICATING METHOD THEREOF, AND DISPLAYING DEVICE

(71) Applicants: Chengdu BOE Optoelectronics Technology Co., Ltd., Sichuan (CN); BOE Technology Group Co., Ltd., Beijing (CN)

(72) Inventors: Jiaxiang Zhang, Beijing (CN); Jiuyuan Bai, Beijing (CN); Xin Mu, Beijing (CN); Mingqiang Wang, Beijing (CN); Hongjin Hu, Beijing (CN); Fei Li, Beijing (CN); Yonglin Chen, Beijing (CN); Kun Zuo, Beijing (CN); Chang Wang, Beijing (CN); Xin Bi, Beijing (CN); Bin Zhang, Beijing (CN); Seungyong Oh, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/800,660

(22) PCT Filed: Nov. 2, 2021

(86) PCT No.: PCT/CN2021/128104
§ 371 (c)(1),
(2) Date: Aug. 18, 2022

(87) PCT Pub. No.: WO2022/179163
PCT Pub. Date: Sep. 1, 2022

(65) Prior Publication Data
US 2024/0224416 A1   Jul. 4, 2024

(30) Foreign Application Priority Data
Feb. 23, 2021   (CN) .................. 202110201857.X

(51) Int. Cl.
*H05K 1/02* (2006.01)
*H05K 3/38* (2006.01)

(52) U.S. Cl.
CPC ........... *H05K 1/0272* (2013.01); *H05K 1/028* (2013.01); *H05K 3/386* (2013.01); *H05K 2201/10128* (2013.01)

(58) Field of Classification Search
CPC ...... H05K 1/0272; H05K 1/028; H05K 3/386; H05K 2201/10128
See application file for complete search history.

(56) References Cited

U.S. PATENT DOCUMENTS

2007/0184675 A1    8/2007   Ishikawa
2018/0076228 A1*   3/2018   Wang ..................... H01L 23/31
(Continued)

FOREIGN PATENT DOCUMENTS

CN    201365372 Y    12/2009
CN    202262023 U     5/2012
(Continued)

*Primary Examiner* — Hoa C Nguyen
(74) *Attorney, Agent, or Firm* — IPro, PLLC

(57) ABSTRACT

A printed circuit board and a fabricating method thereof, and a displaying device. The printed circuit board includes a hard-board region (30) and a soft-board region (31), the soft-board region (31) is located at the periphery of the first edge (30a) of the hard-board region (30), the printed circuit board within the hard-board region (30) includes a base plate (301), and an adhesive film (302), a covering film (303) and a first metal layer (304) that are arranged in layer configuration on one side of the base plate (301), the adhesive film (302) is closest to the base plate (301), a flow guiding groove (3030) is disposed on the surface of the side of the covering film (303) that is closer to the adhesive film (302), and the flow guiding groove (3030) extends to a second edge (30b) of the hard-board region (30).

16 Claims, 4 Drawing Sheets

(56) References Cited

U.S. PATENT DOCUMENTS

| | | | | |
|---|---|---|---|---|
| 2018/0269178 A1* | 9/2018 | Cheng | .................. | H01L 24/32 |
| 2020/0012039 A1* | 1/2020 | Wang | .................. | G02B 6/0091 |
| 2020/0103682 A1* | 4/2020 | Hu | .................. | G02F 1/133514 |
| 2020/0305289 A1* | 9/2020 | Yu | .................. | H05K 1/0278 |
| 2020/0348009 A1* | 11/2020 | Ansems | .................. | H10K 50/805 |
| 2021/0029838 A1* | 1/2021 | Lee | .................. | B32B 3/04 |
| 2022/0190039 A1* | 6/2022 | Sun | .................. | H10K 71/00 |
| 2022/0390983 A1* | 12/2022 | Gao | .................. | G09F 9/30 |
| 2023/0345619 A1* | 10/2023 | Pu | .................. | H05K 1/0219 |
| 2024/0188376 A1* | 6/2024 | Wei | .................. | H10K 59/80 |

FOREIGN PATENT DOCUMENTS

| | | |
|---|---|---|
| CN | 202979466 U | 6/2013 |
| CN | 207835931 U | 9/2018 |
| CN | 209497675 U | 10/2019 |
| CN | 112867237 A | 5/2021 |

\* cited by examiner

PRINTED CIRCUIT BOARD AND FABRICATING METHOD THEREOF, AND DISPLAYING DEVICE

CROSS REFERENCE TO RELEVANT APPLICATIONS

The present disclosure claims the priority of the Chinese patent application filed on Feb. 23, 2021 before the Chinese Patent Office with the application number of 202110201857.X and the title of "PRINTED CIRCUIT BOARD AND FABRICATING METHOD THEREOF, AND DISPLAYING DEVICE", which is incorporated herein in its entirety by reference.

TECHNICAL FIELD

The present disclosure relates to the technical field of displaying and, more particularly, to a printed circuit board and a fabricating method thereof, and a displaying device.

BACKGROUND

Currently, display products are having more and more prominent demands on full screen, long endurance and 5G communication and so on. All of those demands require that the displaying module have an increasingly more compact structure, so that a room can be left to realize a higher battery capacity, a smaller border frame, a larger antenna clearance area and so on.

The size of a flexible printed circuit board (FPC) has a large influence on the compactness of the structure of the displaying module. In the related art, in the designing of an FPC, it is not only required to satisfy the demand on wiring, but also required to reserve an additional room for adhesive overflowing of the adhesive film, or else overflowing adhesive from the adhesive film may flow to the golden-finger region within the soft-board region, which results in that FPC bonding cannot be performed within the golden-finger region, or results in that the soft-board region is harden and thus cannot be bent.

SUMMARY

The present disclosure provides a printed circuit board, wherein the printed circuit board includes a hard-board region and a soft-board region, and the soft-board region is located at a periphery of a first edge of the hard-board region; and the printed circuit board located in the hard-board region includes a base plate, and an adhesive film, a covering film and a first metal layer that are arranged in layer configuration on one side of the base plate, the adhesive film is closest to the base plate, a flow guiding groove is disposed on a surface of one side of the covering film that is closer to the adhesive film, and the flow guiding groove extends to a second edge of the hard-board region.

In an optional implementation, the hard-board region is quadrilateral, the first edge includes a first side edge of the hard-board region and a second side edge opposite to the first side edge, the second edge includes a third side edge of the hard-board region and a fourth side edge opposite to the third side edge, one end of the flow guiding groove extends to the third side edge, and the other end of the flow guiding groove extends to the fourth side edge.

In an optional implementation, the flow guiding groove is a plurality of flow guiding grooves, and the plurality of flow guiding grooves have equal spacings therebetween and are parallel.

In an optional implementation, an extension direction of the flow guiding groove is parallel to a border line between the hard-board region and the soft-board region.

In an optional implementation, the flow guiding groove includes a first groove and a second groove that are in communication with each other, an extension direction of the first groove is parallel to a border line between the hard-board region and the soft-board region, and the second groove is bent toward the border line.

In an optional implementation, a spacing between the flow guiding groove and the soft-board region is greater than or equal to 1 mm.

In an optional implementation, a depth of the flow guiding groove is less than or equal to a half of a thickness of the covering film.

In an optional implementation, a depth of the flow guiding groove is greater than or equal to 2 μm, and less than or equal to 10 μm.

In an optional implementation, an orthographic projection of a groove opening of the flow guiding groove on the base plate covers an orthographic projection of a groove bottom of the flow guiding groove on the base plate.

In an optional implementation, in an extension direction perpendicular to the flow guiding groove, a width of a groove opening of the flow guiding groove is greater than or equal to 0.5 mm, and less than or equal to 1 mm.

In an optional implementation, a material of the covering film includes polyimide.

In an optional implementation, the adhesive film is formed by solidification of a half-solidified insulating-adhesive sheet.

In an optional implementation, the adhesive film, the covering film and the first metal layer are arranged symmetrically on two sides of the base plate, and a solder resisting layer is disposed on one side of the first metal layer that is away from the base plate.

The present disclosure provides a displaying device, wherein the displaying device includes a display panel and the printed circuit board according to any one of the above implementations connected to the display panel.

In an optional implementation, the displaying device further includes a Chip-on film, and the printed circuit board and the display panel are connected by the Chip-on film.

The present disclosure provides a method for fabricating a printed circuit board, wherein the printed circuit board includes a hard-board region and a soft-board region, and the soft-board region is located at a periphery of a first edge of the hard-board region; and the printed circuit board within the hard-board region is fabricated by:

providing a base plate;

adhering sequentially an adhesive film, a covering film and a first metal layer on one side of the base plate, wherein a flow guiding groove is disposed on a surface of one side of the covering film that is closer to the adhesive film, the flow guiding groove extends to a second edge of the hard-board region, and the flow guiding groove is configured for guiding an overflowing adhesive of the adhesive film to flow to a peripheral region of the second edge; and cutting along the second edge, to cut off the peripheral region of the second edge, to obtain the printed circuit board.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are embodiments of the present disclosure, and a person skilled in the art can obtain other figures according to these figures without paying creative work.

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figures 1A, 1B:
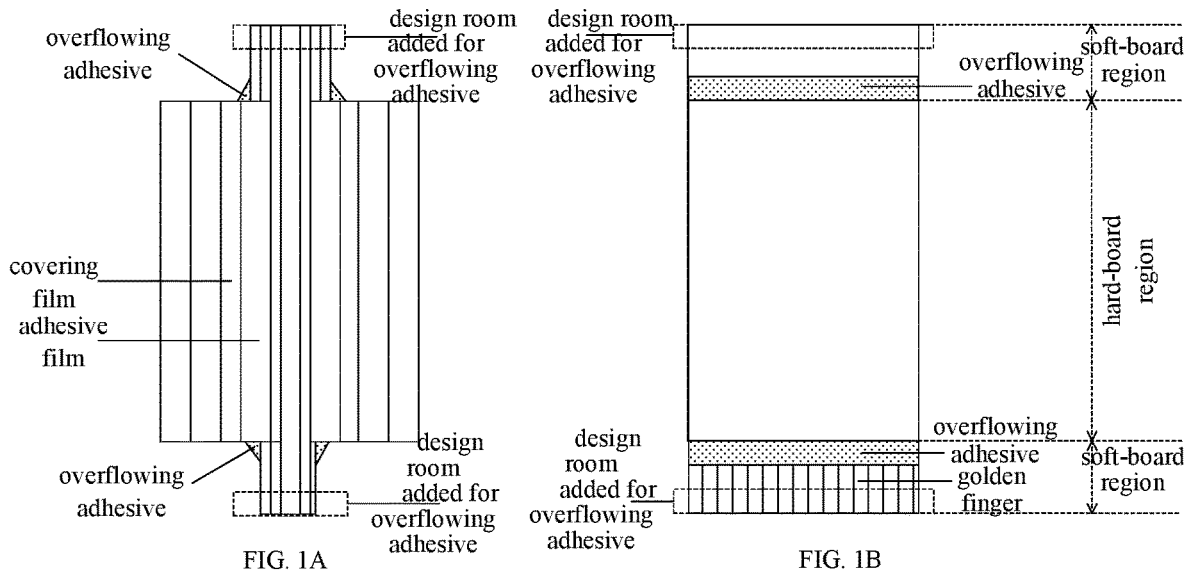
FIG. 1A and FIG. 1B show a schematic diagram showing the structure of a printed circuit board in the related art.

Referring to FIG. 1A and FIG. 1B, FIG. 1A and FIG. 1B show a sectional diagram showing the structure of a printed circuit board in the related art, and FIG. 1B shows a schematic diagram showing the planar structure of a printed circuit board in the related art. In the printed circuit boards in the related art, it is not only required to provide a room for wiring, but also required to provide an additional room for adhesive overflowing of the adhesive film, or, in other words, it is required to reserve an additional overflowing-adhesive region, or else overflowing adhesive coming from the adhesive film may flow into the soft-board region, which results in that the golden fingers within the soft-board region cannot perform the FPC bonding, or results in that the soft-board region is harden and thus cannot be bent.

Figure 2:
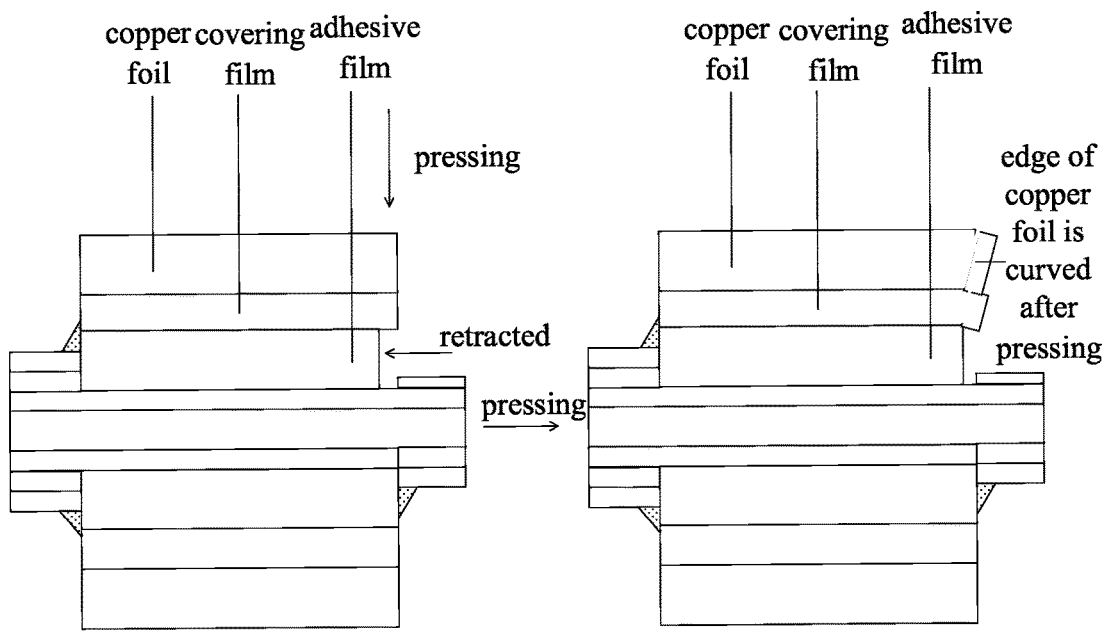
FIG. 2 shows a schematic diagram showing the structure of another printed circuit board in the related art.

In the related art, the solution for ameliorating the adhesive overflowing is usually adhesive-film inward retraction (in other words, the adhesive film is retracted in relative to the copper foil), as shown in FIG. 2. However, because the adhesive overflowing of the adhesive film is not even, in part of the region, there are less overflowing adhesive than in other parts of the region, which results in that the overflowing adhesive cannot fill the whole region of the copper foil, the edge of the copper foil has a suspending region, after the pressing process, the edge of copper foil is curved, and the curved copper-foil edge easily causes imperfects such as short circuiting and open circuit.

Figures 3A, 3B:
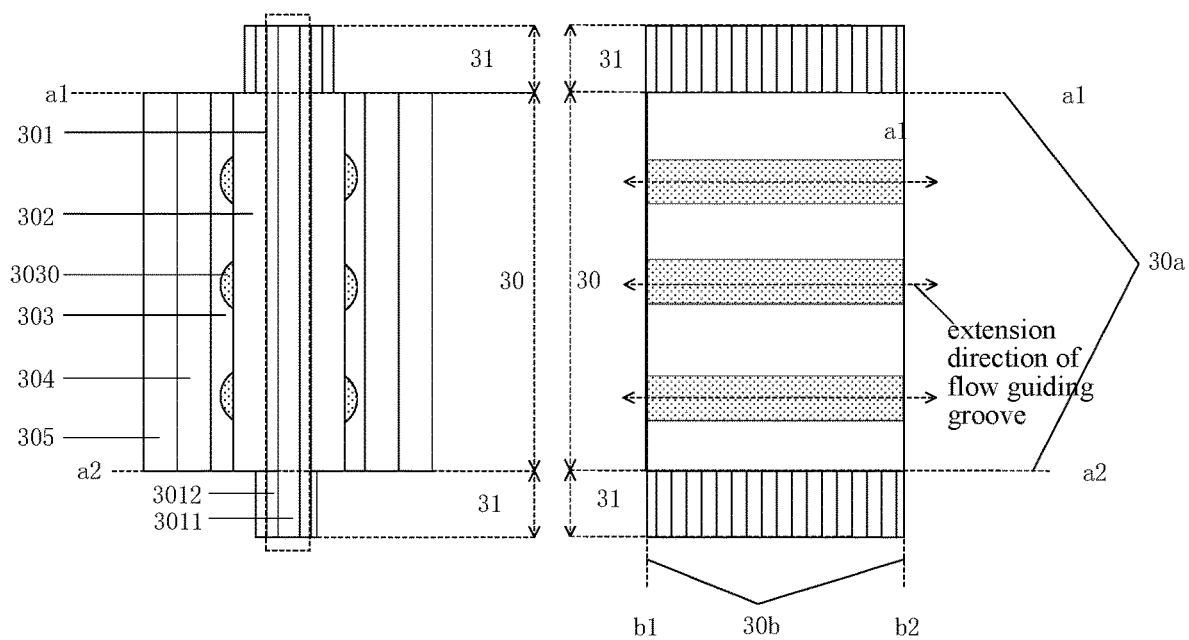
FIG. 3A and FIG. 3B show a schematic diagram showing the structure of the printed circuit board according to an embodiment of the present disclosure.

An embodiment of the present disclosure provides a printed circuit board. FIG. 3A shows a sectional diagram showing the structure of a printed circuit board according to the present embodiment, and FIG. 3B shows a schematic diagram showing the planar structure of a printed circuit board according to the present embodiment. The printed circuit board includes a hard-board region 30 and a soft-board region 31, and the soft-board region 31 is located at the periphery of the first edge 30a of the hard-board region 30. As shown in FIG. 3A, the printed circuit board within the hard-board region 30 includes a base plate 301, and an adhesive film 302, a covering film 303 and a first metal layer 304 that are arranged in layer configuration on one side of the base plate 301, the adhesive film 302 is closest to the base plate 301, a flow guiding groove 3030 is disposed on the surface of the side of the covering film 303 that is closer to the adhesive film 302, and the flow guiding groove 3030 extends to a second edge 30b of the hard-board region 30.

The printed circuit board according to the present embodiment is a soft-hard combined board. The quantity of the layers of the printed circuit board within the hard-board region 30 is greater than the quantity of the layers of the printed circuit board within the soft-board region 31, and because the adhesive film 302 is provided within the hard-board region 30, the hardness of the hard-board region 30 is greater than the hardness of the soft-board region 31.

The printed circuit board within the hard-board region 30 may be one of a two-layer printed circuit board, a three-layer printed circuit board, a four-layer printed circuit board, a five-layer printed circuit board, a six-layer printed circuit board, a seven-layer printed circuit board, an eight-layer printed circuit board and so on, which is not limited in the present embodiment.

The material of the covering film 303 may include a polymer thin-film material such as polyimide, which is not limited in the present embodiment.

The adhesive film 302 may be formed by the solidification of a half-solidified material such as an insulating-adhesive sheet, which is not limited in the present embodiment. The half-solidified insulating-adhesive sheet may be an FPC hardening adhesive, which is referred to for short as PrePreg, also referred to as a presoak material, and usually used for the cohesion of the inner-layer electrically conductive pattern and the inter-layer insulation of multilayer printed circuit boards. In the lamination, the epoxy resin (AD adhesive) of the prepreg melts, flows and solidifies, to cohere the layers of the electric circuits together, to form a reliable insulating layer.

As shown in FIG. 3A, the adhesive film 302, the covering film 303 and the first metal layer 304 may be arranged symmetrically on the two sides of the base plate 301, and a solder resisting layer 305 may be disposed on the side of the first metal layer 304 that is away from the base plate 301, wherein the solder resisting layer 305 is used to protect the internal structure of the printed circuit board.

Optionally, as shown in FIG. 3A, the base plate 301 may include a substrate 3011 and second metal layers 3012 symmetrically arranged on the two sides of the substrate 3011, and the adhesive films 302 are arranged on the sides of the second metal layers 3012 that are further from the substrate 3011. The material of the substrate 3011 may include a polymer thin-film material such as polyimide.

The materials of the first metal layer 304 and the second metal layers 3012 may be, for example, a copper foil, which is not limited in the present embodiment.

The flow guiding groove 3030 is disposed at the adhering face of the covering film 303 that faces the adhesive film 302, and the flow guiding groove 3030 is for guiding an overflowing adhesive of the adhesive film 302 to flow to the peripheral region of the second edge 30b. In the process of the adhering and pressing of the first metal layer 304, the overflowing adhesive of the adhesive film 302 can effectively flow to the periphery of the second edge 30b via the flow guiding groove 3030 on the covering film 303. The periphery of the second edge 30b is an overflowing-adhesive enhancing region, and within the region no soft-board region 31 and soft-hard combined region are disposed. Therefore, after the adhering and pressing has been completed, cutting along the second edge 30b may be performed, to cut off the overflowing adhesive guided to flow out of the flow guiding groove 3030 together with the leftover material of the multilayer board. By disposing the flow guiding groove 3030 on the covering film 303, to guide the overflowing adhesive to flow to the periphery of the second edge 30b, the overflowing-adhesive amount at the periphery of the first edge 30a, i.e., the soft-board region 31, can be effectively reduced or eliminated, and, in the designing of the printed circuit board, the reserved overflowing-adhesive room can be reduced, thereby effectively reducing the design room of the printed circuit board.

Because the overflowing-adhesive amount of the adhesive overflowing to the soft-board region 31 is reduced or eliminated, the reserved overflowing-adhesive length can be reduced, whereby even a printed circuit board of a low size can effectively prevent the problem of adhesive overflowing to the golden-finger region, which results in that the golden-finger region cannot be bonded, so as to prevent the problem of adhesive overflowing to the soft-board region 31, which results in that the soft-board region 31 is hardened and thus cannot be bent.

In the printed circuit board according to the present embodiment, by disposing the flow guiding groove 3030 on the surface of the side of the covering film 303 that is closer to the adhesive film 302, and configuring that the flow guiding groove 3030 extends to the second edge 30b of the hard-board region 30, in the process of the adhering and pressing of the first metal layer 304, the overflowing adhesive of the adhesive film 302 can be effectively guided to flow to the periphery of the second edge 30b of the hard-board region 30 via the flow guiding groove 3030. Because the soft-board region 31 is located at the periphery of the first edge 30a of the hard-board region 30, the present solution can effectively reduce the overflowing adhesive that flows to the soft-board region 31, and reduce the overflowing-adhesive amount of the soft-board region 31, which in turn can reduce the reserved overflowing-adhesive room of the soft-board region 31, effectively reduce the designed size of the printed circuit board, satisfy the demand on the compact room of the displaying module by the terminals, effectively reduce the space structure of the displaying module while reducing the cost, and improve the compactness of the displaying module, to better satisfy the demands of the end customer.

In an optional implementation, as shown in FIG. 3B, the hard-board region 30 is of a quadrilateral shape, the first edge 30a includes a first side edge a1 of the hard-board region 30 and a second side edge a2 opposite to the first side edge a1, the second edge 30b includes a third side edge b1 of the hard-board region 30 and a fourth side edge b2 opposite to the third side edge b1, one end of the flow guiding groove 3030 extends to the third side edge b1, and the other end of the flow guiding groove 3030 extends to the fourth side edge b2.

In the present implementation, the soft-board region 31 is located at the periphery of the first side edge a1 and the periphery of the second side edge a2.

In the present embodiment, the flow guiding groove 3030 is a groove extending throughout the covering film 303 in the extension direction; in other words, the two end openings of the flow guiding groove 3030 individually extend to the third side edge b1 and the fourth side edge b2, which can ensure that the flow guiding groove 3030 can sufficiently guide the overflowing adhesive to flow to the periphery of the third side edge b1 and the periphery of the fourth side edge b2, so as to, to the largest extent, reduce the overflowing-adhesive amount of the soft-board region 31, and reduce the reserved overflowing-adhesive room of the printed circuit board. Certainly, it may also be configured, according to practical demands, that one of the end openings of the flow guiding groove 3030 extends to the third side edge b1, and the other end opening is disposed inside the covering film 303, which is not limited in the present embodiment.

Figure 4A:
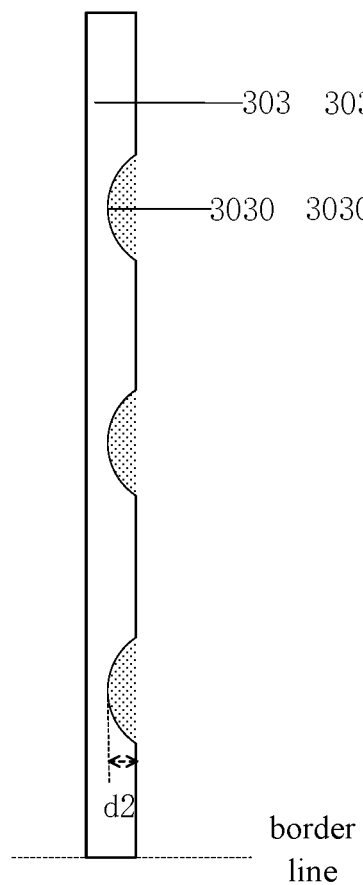
FIGS. 4A and 4B show a schematic diagram showing the structure of the first type of the covering film according to an embodiment of the present disclosure.
Figure 4B:
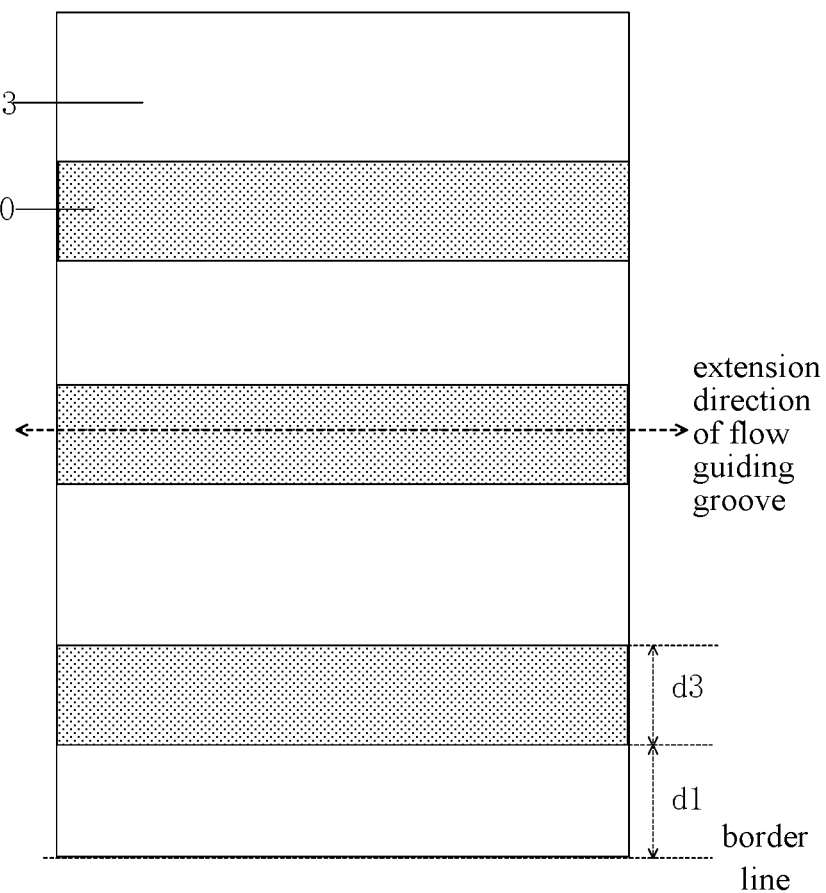

In a particular implementation, a plurality of the flow guiding grooves 3030 may be disposed on the surface of the side of the covering film 303 that is closer to the adhesive film 302. As shown in FIG. 4A, FIG. 4B or FIG. 6, three flow guiding grooves 3030 are disposed on the covering film 303. One flow guiding groove 3030 may also be disposed, as shown in FIG. 5. In a particular implementation, the quantity of the grooves may be set according to factors such as the room of the printed circuit board, the width of the groove openings of the flow guiding groove and the thickness of the adhesive film 302, and is not limited in the present embodiment. When a plurality of the flow guiding grooves 3030 may be disposed on the surface of the side of the covering film 303 that is closer to the adhesive film 302, the difficulty in the process of the grooving can be reduced.

Figures 5A, 5B:
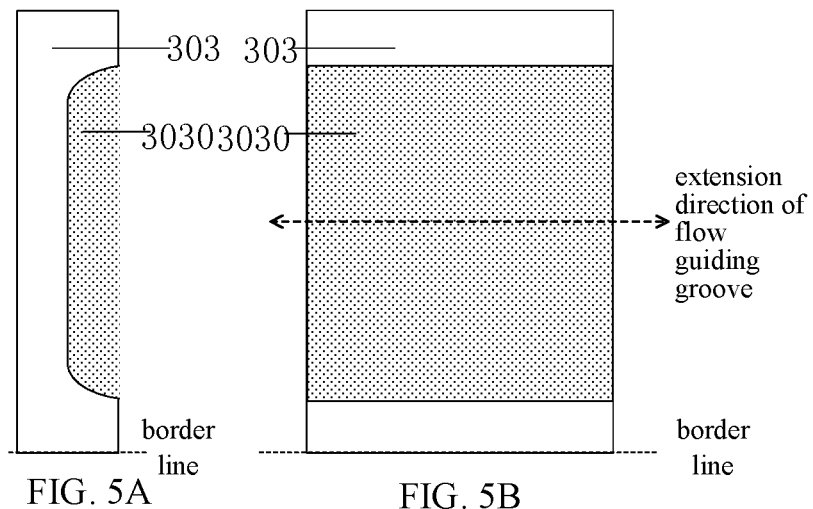
FIGS. 5A and 5B show a schematic diagram showing the structure of the second type of the covering film according to an embodiment of the present disclosure.
Figures 6A, 6B:
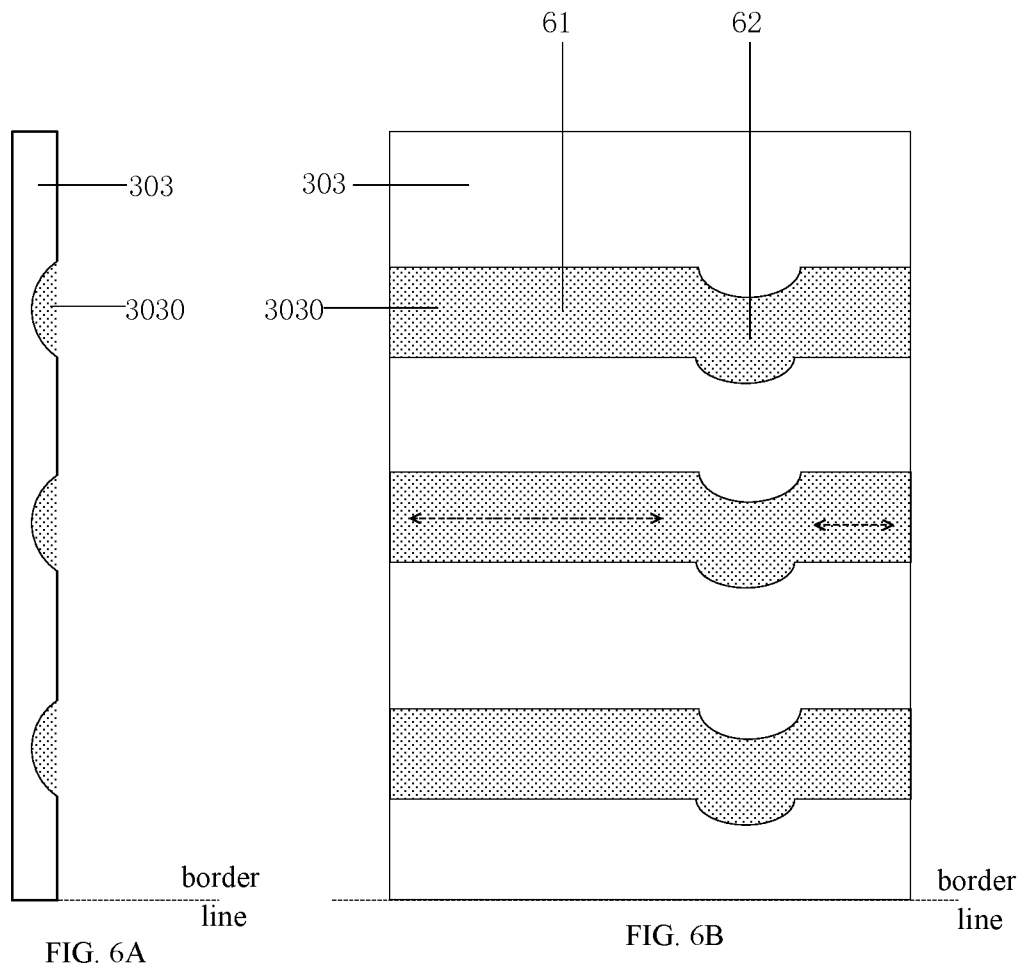
FIGS. 6A and 6B show a schematic diagram showing the structure of the third type of the covering film according to an embodiment of the present disclosure.

FIG. 4A shows a sectional diagram showing the structure of the first type of the covering film according to the present embodiment, and FIG. 4B shows a schematic diagram showing the planar structure of the first type of the covering film according to the present embodiment. FIG. 5A shows a sectional diagram showing the structure of the second type of the covering film according to the present embodiment, and FIG. 5B shows a schematic diagram showing the planar structure of the second type of the covering film according to the present embodiment. FIG. 6A shows a sectional diagram showing the structure of the third type of the covering film according to the present embodiment, and FIG. 6B shows a schematic diagram showing the planar structure of the third type of the covering film according to the present embodiment.

Referring to FIG. 4A, FIG. 4B, FIG. 6A or FIG. 6B, when the flow guiding groove 3030 is a plurality of flow guiding grooves 3030, the plurality of flow guiding grooves 3030 may have equal spacings therebetween and be parallel. In other words, the plurality of flow guiding grooves 3030 are evenly distributed on the surface of the side of the covering film 303 that is closer to the adhesive film 302. That can ensure that the overflowing adhesive of the adhesive film 302 is sufficiently and evenly guided to flow to the periphery of the second edge 30b, to reduce the overflowing-adhesive amount of the soft-board region 31, and reduce the designed size of the printed circuit board.

In an optional implementation, referring to FIGS. 4A, 4B, 5A and 5B, the extension direction of the flow guiding groove 3030 may be parallel to the border line between the hard-board region 30 and the soft-board region 31. Accordingly, in an aspect, the difficulty in the process of the grooving can be reduced, and, in another aspect, it can be ensured that the flow guiding channel of the overflowing adhesive is smooth, so as to, to the largest extent, reduce the overflowing-adhesive amount of the soft-board region 31, and reduce the reserved overflowing-adhesive room of the printed circuit board.

In another optional implementation, referring to FIG. 6A and FIG. 6B, the flow guiding groove 3030 may include a first groove 61 and a second groove 62 that are in communication with each other, the extension direction of the first groove 61 is parallel to the border line between the hard-board region 30 and the soft-board region 31, and the second groove 62 is bent toward the border line. The shape of the second groove 62 may be, for example, a semicircle and a V shape, which is not limited in the present disclosure.

When the hard-board region 30 is of a quadrilateral shape, the border line between the hard-board region 30 and the soft-board region 31 is the first side edge a1 or the second side edge a2.

It should be noted that the shape of the flow guiding groove 3030 is not limited to the shapes shown in FIGS. 4A, 4B, 5A, 5B, 6A and 6B, and the particular shape of the flow guiding groove 3030 is not limited in the present embodiment.

In order to prevent the overflowing adhesive in the flow guiding groove 3030 from flowing to the soft-board region 31, referring to FIGS. 4A and 4B, it may be configured that the spacing d1 between the flow guiding groove 3030 and the border line or the soft-board region 31 is greater than or equal to 1 mm. The border line is the border line between the hard-board region 30 and the soft-board region 31.

It should be noted that, in an embodiment of the present disclosure, as shown in FIGS. 4A and 4B, the spacing d1 between the flow guiding groove 3030 and the border line refers to the minimum spacing between the flow guiding groove 3030 and the border line, i.e., the shortest distance between the flow guiding groove 3030 and the border line.

In an optional implementation, referring to FIGS. 4A and 4B, the depth d2 of the flow guiding groove 3030 may be less than or equal to a half of the thickness of the covering film 303. That can ensure that the covering film 303 completely covers the first metal layer 304, to protect the first metal layer 304 from corrosion, to prevent the risk of exposure of the first metal layer 304 caused by a too low thickness of the covering film 303 within the region of the flow guiding groove 3030.

In a particular implementation, the depth d2 of the flow guiding groove 3030 may, for example, be greater than or equal to 2 μm, and less than or equal to 10 μm, which may be particularly set according to practical demands, and is not limited in the present embodiment.

It should be noted that the depth of the flow guiding groove 3030 refers to the dimension of the flow guiding groove 3030 in the direction perpendicular to the base plate 301.

In a particular implementation, as shown in FIGS. 4A, 4B, 5A, 5B, 6A to 6B, the orthographic projection of the groove opening of the flow guiding groove 3030 on the base plate 301 covers the orthographic projection of the groove bottom of the flow guiding groove 3030 on the base plate 301. In other words, the opening of the flow guiding groove 3030 that is further from the base plate 301 is larger than the opening closer to the base plate 301. Accordingly, not only the flow guiding groove 3030 can contain more overflowing adhesive, but also that can reduce the influence on the first metal layer 304 by the flow guiding groove 3030 to the greatest extent. For example, the shape of the cross-section of the flow guiding groove 3030 perpendicular to the extension direction may be a semicircle, a V shape, a reverse trapezoid and so on, which is not limited in the present embodiment.

In a particular implementation, referring to FIGS. 4A and 4B, in the extension direction perpendicular to the flow guiding groove 3030, the width d3 of the groove opening of the flow guiding groove 3030 may be greater than or equal to 0.5 mm, and less than or equal to 1 mm. The width of the groove opening of the flow guiding groove 3030 may be determined comprehensively according to factors such as the quantity of the flow guiding grooves 3030, the thickness of the adhesive film 302 and the size of the covering film 303, which is not limited in the present embodiment.

In the present embodiment, the particular shapes, positions and relative position relations of the components of the printed circuit board may be configured according to demands. In the practical process, because of the limitation by the process conditions or other factors, some errors might emerge. Therefore, the shapes, positions and relative position relations of the components of the printed circuit board are merely required to substantially satisfy above conditions, and all of the printed circuit boards fall within the scope of the embodiments of the present disclosure.

An embodiment of the present disclosure further provides a displaying device, wherein the displaying device includes a display panel and the printed circuit board according to any one of the above embodiments connected to the display panel.

In a particular implementation, the display panel and the printed circuit board may be directly connected or indirectly connected, which may be particularly determined according to the packaging mode of the display panel and so on, which is not limited in the present disclosure.

In an optional implementation, the packaging mode of the display panel is COP (chip on plastic), and the printed circuit board may be directly connected to the bonding region of the display panel.

In another optional implementation, the packaging mode of the display panel is COG (chip on glass), and the printed circuit board may be directly connected to the bonding region of the display panel.

In another optional implementation, the packaging mode of the display panel is COF (chip on film), the displaying device may further include a Chip-on film, and the printed circuit board and the display panel are connected by the Chip-on film. Particularly, one end of the Chip-on film is connected to the bonding region of the display panel, and the other end is connected to the printed circuit board.

It should be noted that the displaying device according to the present embodiment may be any products or components that have the function of 2D or 3D displaying, such as an electronic paper, a mobile phone, a tablet personal computer, a TV set, a notebook computer, a digital photo frame and a navigator.

An embodiment of the present disclosure further provides a method for fabricating a printed circuit board. The printed circuit board includes a hard-board region 30 and a soft-board region 31, and, as shown in FIG. 3, the soft-board region 31 is located at the periphery of the first edge 30*a* of the hard-board region 30. The printed circuit board within the hard-board region 30 is fabricated by:

Step 701: providing a base plate 301.

Step 702: adhering sequentially an adhesive film 302, a covering film 303 and a first metal layer 304 on one side of the base plate 301, wherein a flow guiding groove 3030 is disposed on the surface of the side of the covering film 303 that is closer to the adhesive film 302, the flow guiding groove 3030 extends to a second edge 30b of the hard-board region 30, and the flow guiding groove 3030 is configured for guiding an overflowing adhesive of the adhesive film 302 to flow to the peripheral region of the second edge 30b.

Step 703: cutting along the second edge 30b, to cut off the peripheral region of the second edge 30b, to obtain the printed circuit board.

By using the fabricating method according to the present embodiment, the printed circuit board according to any one of the above embodiments can be obtained. The structure and the effect of the printed circuit board may refer to the above embodiments, and are not discussed herein further.

The embodiments of the present disclosure provide a printed circuit board and a fabricating method thereof, and a displaying device. The printed circuit board includes a hard-board region 30 and a soft-board region 31, and the soft-board region 31 is located at the periphery of the first edge 30a of the hard-board region 30. The printed circuit board within the hard-board region 30 includes a base plate 301, and an adhesive film 302, a covering film 303 and a first metal layer 304 that are arranged in layer configuration on one side of the base plate 301, the adhesive film 302 is closest to the base plate 301, a flow guiding groove 3030 is disposed on the surface of the side of the covering film 303 that is closer to the adhesive film 302, and the flow guiding groove 3030 extends to a second edge 30b of the hard-board region 30. In the technical solutions of the present disclosure, by disposing the flow guiding groove 3030 on the surface of the side of the covering film 303 that is closer to the adhesive film 302, and configuring that the flow guiding groove 3030 extends to the second edge 30b of the hard-board region 30, in the process of the adhering and pressing of the first metal layer 304, the overflowing adhesive of the adhesive film 302 can be effectively guided to flow to the periphery of the second edge 30b of the hard-board region 30 via the flow guiding groove 3030. Because the soft-board region 31 is located at the periphery of the first edge 30a of the hard-board region 30, the present solution can effectively reduce the overflowing adhesive that flows to the soft-board region 31, and reduce the overflowing-adhesive amount of the soft-board region 31, which in turn can reduce the reserved overflowing-adhesive room of the soft-board region 31, effectively reduce the designed size of the printed circuit board, satisfy the demand on the compact room of the displaying module by the terminals, and improve the compactness of the displaying device.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order.

Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The printed circuit board and the fabricating method thereof, and the displaying device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A printed circuit board, wherein the printed circuit board comprises a hard-board region and a soft-board region, and the soft-board region is located at a periphery of a first edge of the hard-board region; and the printed circuit board located in the hard-board region comprises a base plate, and an adhesive film, a covering film and a first metal layer that are arranged in layer configuration on one side of the base plate, the adhesive film is closest to the base plate, a flow guiding groove is disposed on a surface of one side of the covering film that is closer to the adhesive film, and the flow guiding groove extends to a second edge of the hard-board region.

2. The printed circuit board according to claim 1, wherein the hard-board region is quadrilateral, the first edge comprises a first side edge of the hard-board region and a second side edge opposite to the first side edge, the second edge comprises a third side edge of the hard-board region and a fourth side edge opposite to the third side edge, one end of the flow guiding groove extends to the third side edge, and the other end of the flow guiding groove extends to the fourth side edge.

3. The printed circuit board according to claim 1, wherein the flow guiding groove is a plurality of flow guiding grooves, and the plurality of flow guiding grooves have equal spacings therebetween and are parallel.

4. The printed circuit board according to claim 1, wherein an extension direction of the flow guiding groove is parallel to a border line between the hard-board region and the soft-board region.

5. The printed circuit board according to claim 1, wherein the flow guiding groove comprises a first groove and a second groove that are in communication with each other, an extension direction of the first groove is parallel to a border line between the hard-board region and the soft-board region, and the second groove is bent toward the border line.

6. The printed circuit board according to claim 1, wherein a spacing between the flow guiding groove and the soft-board region is greater than or equal to 1 mm.

7. The printed circuit board according to claim 1, wherein a depth of the flow guiding groove is less than or equal to a half of a thickness of the covering film.

8. The printed circuit board according to claim 1, wherein a depth of the flow guiding groove is greater than or equal to 2 μm, and less than or equal to 10 μm.

9. The printed circuit board according to claim 1, wherein an orthographic projection of a groove opening of the flow guiding groove on the base plate covers an orthographic projection of a groove bottom of the flow guiding groove on the base plate.

10. The printed circuit board according to claim 9, wherein in an extension direction perpendicular to the flow guiding groove, a width of a groove opening of the flow guiding groove is greater than or equal to 0.5 mm, and less than or equal to 1 mm.

11. The printed circuit board according to claim 1, wherein a material of the covering film comprises polyimide.

12. The printed circuit board according to claim 1, wherein the adhesive film is formed by solidification of a half-solidified insulating-adhesive sheet.

13. The printed circuit board according to claim 1, wherein the adhesive film, the covering film and the first metal layer are arranged symmetrically on two sides of the base plate, and a solder resisting layer is disposed on one side of the first metal layer that is away from the base plate.

14. A displaying device, wherein the displaying device comprises a display panel and the printed circuit board according to claim 1, wherein the printed circuit board is connected to the display panel.

15. The displaying device according to claim 14, wherein the displaying device further comprises a Chip-on film, and the printed circuit board and the display panel are connected by the Chip-on film.

16. A method for fabricating a printed circuit board, wherein the printed circuit board comprises a hard-board region and a soft-board region, and the soft-board region is located at a periphery of a first edge of the hard-board region; and the printed circuit board located in the hard-board region is manufactured by:

providing a base plate;

sequentially adhering an adhesive film, a covering film and a first metal layer on one side of the base plate, wherein a flow guiding groove is disposed on a surface of one side of the covering film that is closer to the adhesive film, the flow guiding groove extends to a second edge of the hard-board region, and the flow guiding groove is configured for guiding an overflowing adhesive of the adhesive film to flow to a peripheral region of the second edge; and cutting along the second edge, to cut off the peripheral region of the second edge, to obtain the printed circuit board.

* * * * *